United States Patent [19]

Schwartz

[11] 4,051,358
[45] Sept. 27, 1977

[54] APPARATUS AND METHOD FOR COMPOSING DIGITAL INFORMATION ON A DATA BUS

[75] Inventor: Samuel Schwartz, Saratoga, Calif.
[73] Assignee: Intel Corporation, Santa Clara, Calif.
[21] Appl. No.: 659,767
[22] Filed: Feb. 20, 1976
[51] Int. Cl.² .............................................. G06F 7/00
[52] U.S. Cl. .................................. 364/716; 340/166 R
[58] Field of Search ........................... 235/164, 156; 340/166 R; 307/207

[56] References Cited

U.S. PATENT DOCUMENTS

| 3,818,203 | 6/1974 | Perlowski et al. | 235/164 |
| 3,961,750 | 6/1976 | Dao | 235/164 |

OTHER PUBLICATIONS

W. R. Nordquist & W. N. Toy, "A Novel Rotate & Shift Circuit using Bidirectional Gates" *IEEE Trans. on Computers*, vol. C-19, No. 9, Sept. 1970, pp. 802–808.

*Primary Examiner*—David H. Malzahn
*Attorney, Agent, or Firm*—Spensley, Horn, Jubas & Lubitz

[57] ABSTRACT

Logical and arithmetic shifts, rotations, and compositions of digital words can be performed directly on the data bus by use of registers which are selectively coupled to the data bus through bidirectional devices. The registers may be buffered latches having a tri-stated buffered output so that the contents of the register will not be altered by stray charges stored in the distributed capacitance of the selected data bus line.

18 Claims, 3 Drawing Figures

APPARATUS AND METHOD FOR COMPRISING DIGITAL INFORMATION ON A DATA BUS

BACKGROUND OF THE INVENTION

1. Field of the Invention

The present invention relates to apparatus for shifting, rotating and composing digital information and more specifically relates to such apparatus employing a matrix of bidirectional devices.

2. Description of the Prior Art

Typically, rotations, transpositions, arithmetic and logical shifts have been performed by the use of shift registers, multiplexers and binary ranked shifters. Such devices employ relatively complex circuitry which usually entails comparatively slow operational speeds and large amounts of silicon chip area when fabricated in an integrated circuit.

In order to simplify circuit structure and to increase circuit operational speed, the prior art employs logic matrices having a plurality of columns as inputs and a plurality of rows as outputs. See Perlowski, et al., U.S. Pat. No. 3,818,203. The columns and rows are connected at each intersection by a switching device. The switching devices have typically been grouped into subsets which correspond to the diagonals of the rectangular matrix formed by the input columns and output rows. By selectively writing logical zeroes or ones in various rows and by activating selected diagonals of the switching devices, arithmetic and logical right shifts can be performed in the matrix circuit. The digital information is transmitted through a single device between the input terminals and the output rows.

However, such prior art circuits typically use unidirectional devices, such as junction transistors, so that digital information can move in only one direction through the matrix. Moreover, input information is presented on the columns and then presented on the rows at the next clock pulse. No provision was made for temporarily storing digital information within the matrix circuit. This limitation of prior art matrix circuits limits their ultimate capability to simple rotations and shifts and prevents their application to more complex data manipulations. Furthermore, prior art matrix circuits were typically structured in a rectangular form so that the input columns were substantially at right angles to the output rows. This orthogonal and rectangular topology limits the flexibility by which such circuits may be topologically incorporated into an integrated circuit chip, increases the amount of chip space devoted to such a circuit, and requires the existence of separate regions within the integrated circuit to be set aside for the function performed by the matrix circuit.

BRIEF SUMMARY OF THE INVENTION

The present invention is a digital logic circuit designed for the manipulation of digital signals. The logic circuit comprises an array of conductive lines forming a matrix of columns and rows. A plurality of bidirectional coupling means couples selected columns with selected rows. Each of the selected rows are coupled to one of the corresponding selected columns at an intersection of the selected column with the selected row within the matrix. The bidirectional coupling means couples digital signals from the rows to the columns and from the columns to the rows. A plurality of conductive control lines are coupled to the bidirectional coupling means. Each one of the control lines is coupled in common to the coupling means which lie along a diagonal of the matrix. The control lines communicate a control signal to each of the coupling means on a corresponding matrix diagonal. Finally, a plurality of register means are employed for storing digital information. Each of the register means is coupled to one of the columns of the matrix.

The register means may be a buffered latch which has a single tri-state input-output terminal. The input-output terminal has high, low, and floating output potential levels. The output of the buffer is set at the floating output potential whenever the digital signals on the columns of the matrix are coupled to the buffered latch.

The present invention may be employed for simultaneously manipulating a plurality of digital signals on a plurality of data bus lines having a first ordered sequence. The method for simultaneously manipulating the digital signals comprises the steps of coupling the plurality of digital signals to the plurality of data bus lines in the integrated circuit. The plurality of digital signals then assume the first ordered sequence of the data bus lines. At least some of the digital signals are selectively coupled through a first plurality of bidirectional devices to a plurality of conductive columns having a second ordered sequence. Each of the columns are coupled to at least one of the data bus lines by one of the bidirectional devices. The digital signals on the columns are stored in a plurality of latches, each column being coupled to one of the latches. The latch latches the column to a stored logical value corresponding to the logical value of the digital signal coupled to the latch. An ordered subsequence of the second ordered sequence of columns is then selectively coupled through a second plurality of bidirectional devices to the plurality of data bus lines. The digital signals on the plurality of data bus lines assumes the ordered subsequence corresponding to the columns.

DETAILED DESCRIPTION OF THE PREFERRED EMBODIMENTS

The present invention is a matrix logic circuit in which the rows of the matrix are the data bus lines in an integrated circuit and the columns are conductive lines which are coupled through bidirectional devices to a plurality of registers. By a method of selectively coupling the data bus lines to the registers, digital words may be manipulated as they propagate along the data bus. Such manipulations include, but are not limited to, right and left arithmetic and logical shifts, transpositions, rotations, and other more complex manipulations. In addition, the use of the registers in conjunction with the bidirectional devices permits operations to be performed upon digital words having variable word lengths.

Since each data bus line is associated with a substantial amount of distributed capacitance, the registers may be buffered by appropriate circuitry so that the stored digital information is not destroyed or altered by the existence of accummulated stray charges on the data bus line to which the register may be coupled. The method of the present invention and its various structural embodiments may be better understood by viewing FIGS. 1 - 3.

Figure 1:
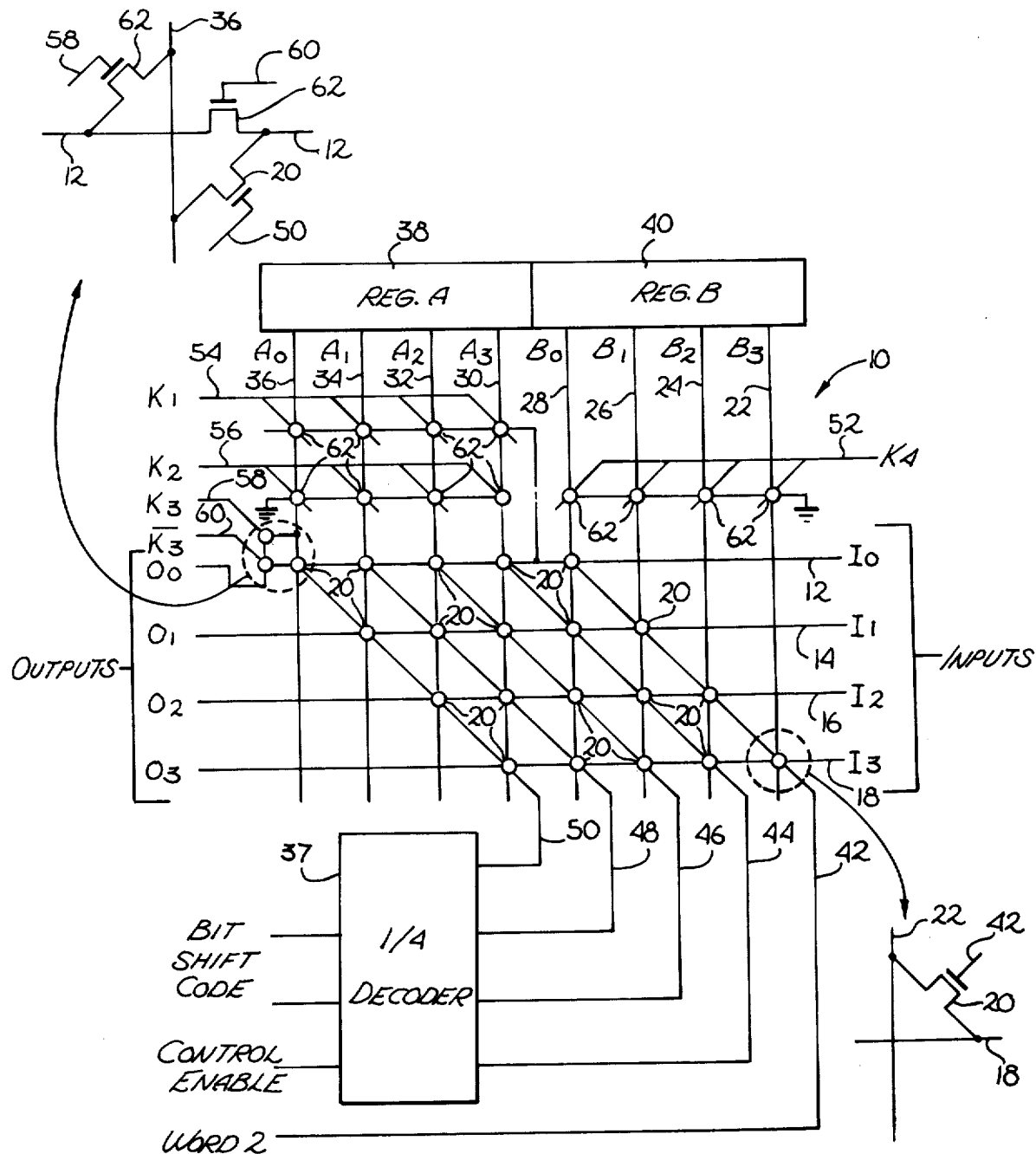
FIG. 1 is a symbolic schematic of the present invention showing the data bus lines as selectively coupled at a plurality of points to a plurality of registers.

FIG. 1 is a simplified schematic of one embodiment of the present invention. The digital logic circuit is formed from an array of conductive lines forming what may be conceptionalized as a matrix of columns and rows. For the purposes of illustration the rows of matrix 10 are shown as being formed from a plurality of data bus lines 12, 14, 16, and 18. The illustrated digital logic circuit is shown as manipulating four bit binary words. The data bus lines have been shown as four in number for the purposes of simplicity only and may be increased or decreased by any number according to the given application. Each of the data bus lines, 12, 14, 16, and 18 are continuous conductive paths which extend, for example, in a linear direction across a portion of a silicon integrated circuit chip. The opposing ends of data bus lines 12, 14, 16 and 18 form what may be conceptualized as input and output terminals for the purposes of the present digital logic circuit. Each of data bus lines 12, 14, 16, and 18 may be coupled at selected points through a plurality of a bidirectional devices 20 to a second plurality of conductive lines 22 - 36. The second plurality of conductive lines 22 - 36 may be conceptionalized as the columns of the matrix array. Each of the conductive lines 22 - 36 may be coupled at one or more points to data bus lines 12 - 18 by means of a bidirectional device 20. Each of conductive columns 22 - 36 may be associated with one or more registers 38 or 40. Thus, digital signals on data bus lines 12 - 18 may be selectively coupled with conductive columns 22 - 36 through bidirectional coupling means 20 and may be stored in either one or both of registers 38 or 40.

Bidirectional coupling means 20 are grouped into subsets along what may be conceptionalized as diagonals 42 - 50 of matrix 10. In the case where bidirectional coupling means 20 is an MOS field effect transistor, each of diagonal control lines 42 - 50 may be coupled to the MOS bidirectional transistors corresponding to the intersections of matrix 10 lying along a common diagonal. In such a case the MOS bidirectional device is characterized by having a gate coupled to a selected diagonal control line and a first and second region which are coupled to a selected one of the conductive columns 22 - 36 and a selected one of data bus lines 12 - 18 respectively. It is to be understood that references to an MOS device are not intended to be strictly construed as metal on semiconductor devices, but to devices fabricated according to a technology the same or similar to MOS devices. For example, devices known as field effect transistors, IGFETS, and the like are included.

As illustrated in FIG. 1, by way of example, at least some of diagonal control lines 42 - 50 may be coupled to a decoder 37. Any decoder well known to the art may be employed to accept a digital instruction, decode and selectively activate one of diagonal control lines 42 - 50 in response to the binary instruction. It is also possible that one or more of diagonal control lines 42 - 50 may be directly activated by a control signal coupled to the selected diagonal control line. For example, in FIG. 1 diagonal control lines 44 - 50 are shown as coupled to a one of four decoder having a two bit binary instruction and a control enable signal as inputs. In addition, diagonal control line 42 is directly coupled to a terminal at which a control signal may be received. Only five diagonal control lines are illustrated in FIG. 1 for the sake of simplicity. The number may be increased or decreased according to the particular application and need not include the cross couple intersections as illustrated. In fact, it is entirely within the scope of the present invention to include diagonal control lines extending along diagonals beginning at the lower left portion of matrix 10 and extending to upper right portions.

It is also possible that subsets of conductive columns 22 - 36 may be coupled to external input lines 52 - 60. In the present embodiment four such external control lines are illustrated although the number may be increased or decreased according to the particular application. In the particular embodiment illustrated, external control line 52 is coupled by coupling means 62 to ground. Coupling means 62 may be of the same class of devices as bidirectional coupling means 20 or may be a unidirectional coupling means, such as junction transistor. Similarly, external input line 54 couples conductive columns 30 - 36 to data bus line 12 by means of a plurality of coupling means 62. External input line 56 also couples conductive columns 30 - 36 to ground through a pllurality of coupling means 62. Finally, external input lines 58 to 60 couple conductive column 36 with data bus line 12 through coupling means 62. As described in greater detail below, external input line 58 serves to connect the input of data bus line 12 to conductive column 36. Similarly, external input line 60 serves to disconnect the input of data bus line 12 with its corresponding output. Although external input lines 52 - 60 are illustrated in FIG. 1 as being directly coupled to the conductive columns 22 - 36 it may be preferable in some applications, in order to increase circuit speed, to couple external digital information directly into the circuitry of registers 38 and 40 rather than to conductive columns 22 - 36. An embodiment which couples externally generated digital information into register 38 and 40 will be described below in greater detail in connection with FIGS. 2 and 3.

In the presently illustrated embodiment each of conductive columns 22 - 36 are associated with either register 38 or 40. In the presently preferred embodiment register 38 and 40 are each comprised of a plurality of latch circuits which serve to store the digital information presented on the corresponding conductive columns. Since each of data bus lines 12 - 18 are associated with relatively large capacitances it may be necessary that the latch circuit 64 have the ability to drive a large capacitive load without losing the stored binary information. For example, assume a one or logical high potential value is stored on one of the conductive columns. If the corresponding selected row were discharged, coupling the selected row to the column would tend to pull the potential value of the columns towards zero or a logical low value. If the column and input of the latch were pulled low enough it is possible that the feedback circuitry of the latch would read a zero or logical low value into the latch thereby causing the latch to ultimately readout a zero or low logical potential. Similarly, it may be possible that a fully charged data bus line could cause a latch having a zero stored value to become charged and change state.

Figure 2:
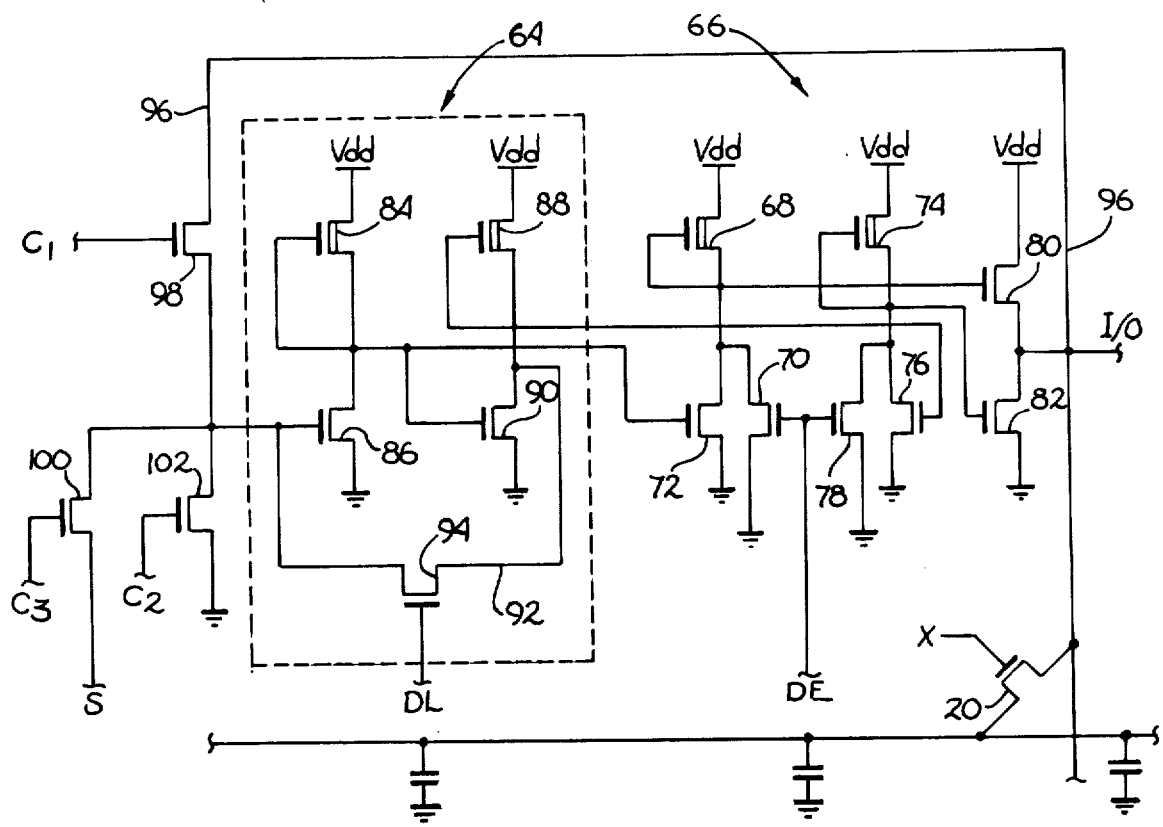
FIG. 2 is a schematic showing one embodiment of the buffered latch which may be used to form one of the registers.

This difficulty may be overcome by providing latch circuit 64 with a buffer circuit 66 as shown in FIG. 2. Thus, when the contents of latch circuit 64 is read, the current drive provided by buffer 66 is sufficiently high to drive the capacitive load of the corresponding data bus line either to one or zero according to the output of the latch and buffer circuit combination. However, since buffer circuit 66 has a high current output and drives a low impedance, it is difficult to store information into latch circuit 64 by coupling a digital signal through buffer circuit 66. Therefore, buffer circuit 66 must have a tristate output, or have an output capable of obtaining a high, low and floating potential value. Thus, when data is to be stored in latch circuit 64, the input load presented by buffer circuit 66 may be effectively disconnected by setting buffer circuit 66 into the third output state wherein it has a floating output potential. In this case buffer circuit 66 may be bypassed through a gated line coupling the conductive column with the input of latch circuit 64.

Figure 3:
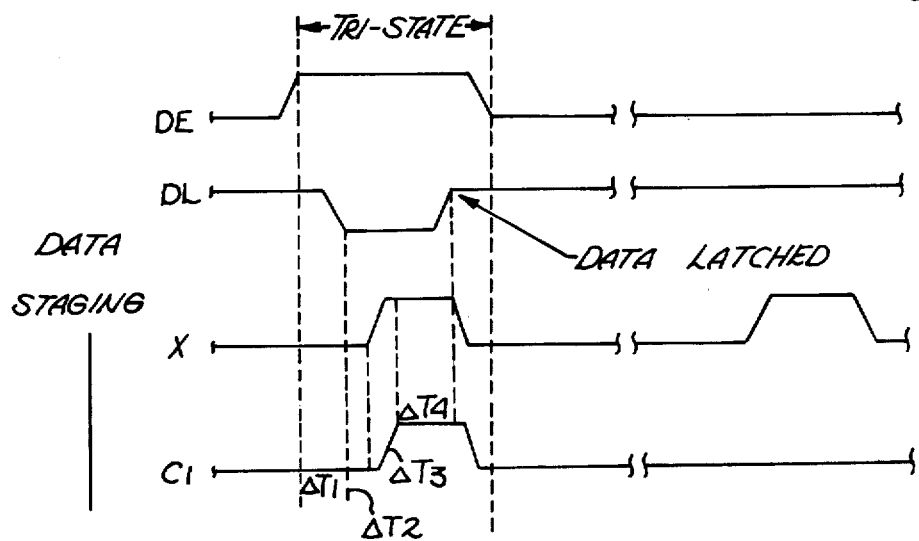
FIG. 3 is a timing diagram corresponding to the data input and output cycles of the buffered latch illustrated in FIG. 2.

One embodiment of latch circuit 64 and buffer circuit 66 may be understood with reference to FIGS. 2 and 3. Throughout this specification it is assumed that the MOS field effect transistors are enhancement mode devices except as may be required for depletion load devices, as illustrated in FIG. 2 in the latch inverter loads and similar circuitry. Buffer circuit 66 is shown as being comprised of a first and second inverter stage coupled to a pull up and pull down device respectively. The first inverter stage is comprised of a load device 68 coupled in series circuit with two parallel driver devices 70 and 72. In the embodiment illustrated load device 68 and a driver devices 70 and 72 are MOS field effect transistors having a gate and first and second regions. The first region of load device 68 is coupled to a power supply potential Vdd while the second region is coupled to the first regions of driver devices 70 and 72. The second regions of driver devices 70 and 72 are coupled to ground. The gate of load device 68 is bootstrapped or coupled to the second region of load device 68. The input of the first inverter stage is the gate of driver device 72 while the output of the first inverter stage is the gate and second region of load device 68. Similarly, the second inverter stage is comprised of a similar load device 74 in series circuit with parallel driver devices 76 and 78. The output of the first inverter stage is coupled to the gate of a pull up device 80 while the output of the second inverter stage is coupled to the gate of the pull down device 82. Pull up device 80 and pull down device 82 are in series circuit between Vdd and ground and are fairly large devices. The gate of driver device 72 is the input to the first driver stage while the gate of driver device 76 is the input of the second inverter stage. Thus, the inputs to buffer circuit 66 require a double rail output from latch circuit 64.

FIG. 2 illustrates one embodiment for latch circuit 64. Any other embodiment well known to the art may be employed to store digital information coupled to latch circuit 64. As illustrated, latch circuit 64 is comprised of a first and second inverter stage similar to those previously described with respect to buffer circuit 66. The first inverter stage of latch circuit 64 is comprised of load devices 84 in series circuit with driver device 86. Similarly, the second inverter stage of latch circuit 64 is comprised of a load device 88 in series circuit with driver device 90. The input to latch circuit 64 is the gate of driver device 86 while the double rail output of latch circuit 64 is provided by the second region of load device 84 and the second region of load device 88. The second region of load device 88 is also fed back through a gated line 92 and a coupling device 94 to the input of the first inverter stage or gate of driver device 86. Similarly, the output of buffer circuit 66 is coupled by a bypass line 96 through a coupling device 98 to the input of the first inverter stage or the gate of driver device 86.

FIG. 2 illustrates two external input lines coupled to the input of latch circuit 64. The first input line is gated to the input of latch circuit 64 through a coupling device 100. The second external input line is similarly gated through a coupling device 102. In the present embodiment, external input signal, S, having a logical value equal to the sign bit of data bus line 12 of FIG. 1, is coupled through coupling device 100 to the input of latch circuit 64. The second external input line couples the input of latch circuit 64 through coupling device 102 to ground. The first external input line of FIG. 2 is analogous to external input line 54 FIG. 1 while the second external input line of FIG. 2 is analogous to external input lines 52 and 56 of FIG. 1.

The operation of the buffered latch circuit of FIG. 2 may be better understood by referring to the timing diagram in FIG. 3. During the readout of latch circuit 64, illustrated in the right side of FIG. 3, control signal, DE, coupled to the gates of driver devices 70 and 78, and gating signal, C1, are held low. Data latch signal, DL, remains high thereby completing the circuit of feedback line 92. Assume for example that a one has been stored on the gate of driver device 86 during a prior storage operation. The one on the gate of driver device 86 causes device 86 to be conductive and the second region of load device 84 to be set at a logical zero. A logical zero output from the first inverter stage of latch circuit 64 causes driver device 90 to remain nonconductive and a logical one to be generated on the output of the second inverter stage or the second region of load device 88. The logical one on the output of the second inverter stage is fed back through feedback line 92, through coupling device 94 to the gate of driver device 86 thereby maintaining the latch in its preset state. The double rail output from the first and second inverter stages of latch circuit 64 are provided to the gates of driver devices 72 and 76 of the first and second inverter stages of buffer circuit 66. A logical zero applied by latch circuit 64 to the gate of driver device 72 causes the device to remain nonconductive while the logical one applied to the gate of driver device 76 causes it to become conductive. Thus, the output or second region of load device 68 is set at a logical one while the output or second region of load device 74 is set at a logical zero. This in turn causes pull down device 82 to remain nonconductive while pull up device 80 becomes conductive and the column coupled to buffer circuit 66 is preset at a logical one. Therefore, when data readout signal, X, goes high, bidirectional coupling device 20 becomes conductive thereby connecting the conductive column with the data bus line and setting it at a logical one.

The left hand side of FIG. 3 indicates the control signals during the input phase of the data staging. Assume for example that a logical one has been written onto the data bus line which will be selected. The clock signal, disenable, DE, goes to its high state thereby causing driver devices 70 and 78 to become conductive. The output of the first and second inverter stages of buffer circuit 66 are thereby pulled low and logical zeroes transferred onto the gates of both the pull up device 80 and pull down device 82. The output of the buffer circuit is therefore set at an indeterminent or floating potential. After an interval of ΔT1, the clock signal, data latch, DL, goes low causing coupling device 94 to become nonconductive. During this clock, feedback line 92 is open circuited and the input of latch circuit 64 is decoupled from its output. After an interval ΔT2, while clock signal, DE, is still high and clock signal, DL, still low, control signal, X, begins to go high gating one of the bidirectional coupling devices 20, thereby coupling the selected row with the selected column. Assuming that a logical one has been written on the selected row, bidirectional coupling means 20 will write a logical one on the selected column and present the binary information at the output of buffer circuit 66.

Since clock signal, DE, is high the output of buffer circuit 66 is floating and it thereby follows the potential value applied to selected column. After a delay of ΔT3, clock signal, C1, goes high causing coupling device 98 to become conductive. Thus, bypass line 96 is closed circuited and the logical one at the output of buffer 66 is coupled to the input of latch circuit 64. After an interval of ΔT4 following clock signal, C1, clock signal, DL, goes high causing device 94 to become conductive and thereby coupling the output of latch 64 with its input thus completing the latch circuit.

The overall operation of the present invention may now be understood by the following description in reference to FIG. 1. It is to be understood that logical zeroes may be loaded into registers 38 or either by the embodiment of FIG. 1 employing external input line 52 or by the embodiment of FIG. 2 employing coupling device 102. The embodiment of FIG. 2 has been found to increase overall circuit operation speeds.

The present circuit may effect a logical right shift as follows. A binary word is loaded into register 40 by selective activation of diagonal control line 42. Simultaneously or during a subsequent clock pulse, external input line 56 or a plurality of devices in register 38 similar to coupling device 102 may be activated thereby loading logical zones into each latch of register 38. If desired, a three bit right logical shift could then be affected by selectively activating diagonal control line 48. Thus, if the binary word 1111 were stored in register 40, the shifted word appearing at the outputs of data bus lines 12 – 18 would be the three lowest order bits of the word in register 38 and the highest order bit in register 40, namely 0001.

Similarly, a logical left shift may be effected by loading a binary word into register 38 by selectively activating diagonal control line 50 through decoder 37. Simultaneously or during a subsequent clock pulse external input line 52 or a plurality of devices in register 40 similar to coupling device 102 of FIG. 2 is activated. Thus, register 40 is loaded with logical zeroes. If a three bit logical left shift were desired, diagonal control line 44 would be selectively activated by decoder 37. If the binary word 1111 were stored in register 38, the word 1000 would then be presented at the output of data bus lines 12 – 18.

An arithmetic right shift of a binary word shifts the binary word a designated number of orders to the right while replacing each of the vacated bits by the sign bit or highest order of bit of the same word. During the first clock cycle a binary word to be shifted is loaded into register 40 by selectively activating diagonal control line 42. Simultaneously or at a subsequent clock pulse, external input line 54 or coupling device 98 is selectively activated, thereby loading the sign bit or highest order bit of the input word into register 38. If, for example, a two bit right arithmetic shift is desired, diagonal control line 46 is then selectively activated by decoder 37. The new binary word appearing at the output of data bus line 12 - 18 consists of the sign bit at the three highest order bits followed by the highest numeric bit. For example, if the input word was S110, the new binary word appearing at the outputs would be SSS1.

Finally, an arithmetic left shift is defined as retaining the sign bit of the input word while shifting the remaining numeric bits of the word to the left and inserting logical zeroes in the vacated orders. For exaple, a two bit arithmetic left shift on an input word, S101 results in a new binary word S100. During the first clock cycle the input binary word is loaded into register 38 by selective activation of diagonal control line 50. Simultaneously or at a subsequent clock pulse logical zeroes are loaded into register 40 by selected activation of external input line 52 or a plurality of devices in register 40 similar to coupling device 102. External input line 58 then goes high causing external input line 60, which is the logical complement, to go low. Wen external input line 60 goes low, the input of data bus line 12 is disconnected from the output of data bus line 12. The simultaneous activation of external input line 58 directly couples conductive column 36 with the output of data bus line 12. Thus, the sign bit of the input word is preserved and presented as the sign bit of the new word at the output of the data bus lines 12 - 18. Assuming a two bit left shift is desired, diagonal control line 46 is selectively activated by decoder 37 to effect a two bit left arithmetic shift. In the present example the lowest order bit of the four bit binary word becomes the highest order numerical bit of the new binary word and is followed by logical zeroes read from reigster 40.

While the present digital logic circuit has been described in reference to a particular embodiment, and as being used to perform certain data manipulation, it is to be understood that further modifications, alterations, and manipulations may be made and practiced by those having ordinary skill in the art without departing from the spirit and scope of the present invention.

I claim:

1. A digital logic circuit for the manipulation of digital signals comprising:
    an array of conductive lines forming a matrix of columns and rows;
    a plurality of bidirectional coupling means for coupling selected columns with selected rows, each of said selected columns being coupled to one of said corresponding selected rows at an intersection of said selected column with said selected row within said matrix, said bidirectional coupling means coupling said digital signals from said rows to said columns, and from said columns to said rows:
    a plurality of conductive control lines, each of said control lines being coupled to a subset of said coupling means lying along a diagonal of said matrix, said control lines communicating a control signal to each of said coupling means included in said subset on said matrix diagonal; and
    a plurality of register means for storing digital information, each of said register means being coupled to a different one of said columns of said matrix.

2. The circuit of claim 1 further comprising a first control means for selectively applying said control signal to a control line.

3. The circuit of claim 1 further comprising a second control means for selectively applying a predetermined digital input signal to at least one column of said matrix.

4. The circuit of claim 1 wherein said coupling means is a MOS transistor having a first and second region and a gate, said first region being coupled to one of said rows, said second region being coupled to said corresponding column, and said gate being coupled to said control line corresponding to said matrix diagonal including said intersection of said one row and corresponding column.

5. The circuit of claim 1 wherein each one of said plurality of register means is a buffered latch.

6. The circuit of claim 5 wherein said buffered latch has a single tri-state input-output terminal having high, low and floating output potential levels, said input-output terminal having said floating output potential when said digital signals on said columns are read into said buffered latch said buffered latch including disenabling means for setting said input-output terminal at said floating output potential.

7. The circuit of claim 6 wherein said buffered latch is comprised of a latch circuit and a buffer circuit, said buffer circuit having a first and second inverter, each inverter having a load device and driver device coupled in series circuit, and said buffer circuit having a driver stage with a pull-up device and a pull-down device, said load device of said first and second inverter stages being respectively coupled to said pull-up and pull-down devices of said driver stage, said driver device of said first and second inverter stages coupled respectively to a first and second input terminal for a double rail input to said buffer circuit, said first and second inverter stages being disenabled by selective control of a disenabling device coupled in parallel circuit with each of said driver devices of said first and second inverters.

8. The circuit of claim 6 wherein said buffered latch is comprised of a buffer circuit and latch circuit, said buffer circuit having a first and second inverter and a driver stage, said driver stage being disenabled by said disenabling means and thereby assuming said floating output potential in response to a disenabling signal coupled to said disenabling means, said disenabling means being coupled to said first and second inverter stages, said output of said driver stage being coupled to a gate coupled to said latch circuit to bypass said buffer circuit when said driver stage is disenabled.

9. The circuit of claim 8 wherein said latch circuit is comprised of a third and fourth inverter stage, said third inverter stage being coupled to said fourth inverter stage of said inverter circuit and being coupled to said first inverter stage of said buffer circuit, said fourth inverter stage being coupled to a feedback gate, said third inverter of said inverter circuit also being coupled to said feedback gate and said fourth inverter stage being coupled to said second inverter of said buffer circuit.

10. In a digital logic circuit including a matrix of conductive columns and rows coupled at selected matrix intersections of said columns and rows by bidirectional MOS devices wherein bidirectional MOS devices along each diagonal are coupled in common to a control line, a register comprising a plurality of tri-state buffered latch circuits each comprising:
a clocked latch circuit;
a gate selectively coupling said clocked latch circuit to said column; and
a buffer circuit coupling said clocked latch circuit to one of said columns of said matrix, said buffer circuit including at least a first and second inverter stage said buffer circuit further including,
a pull-up device to set a logical one on said column, said pull-up device coupled to said column,
means coupling said first inverter stage to said pull-up device,
a pull-down device to set a logical zero on said column, said pull-down device coupled to said column,
means coupling said pull-down device to said second inverter stage, and
disenabling means for disenabling said first and second inverter stages, said pull-up device and said pull-down device in response to a disenabling signal, said disenabling signal being coupled to said disenabling means when said clocked latch circuit is coupled through said gate to said column.

11. A method for simultaneously manipulating a plurality of digital signals on a plurality of ordered data bus lines in an integrated circuit comprising the steps of:
coupling said plurality of digital signals to said plurality of ordered data bus lines, said plurality of digital signals assuming a first ordered sequence corresponding to said ordered data bus lines;
selectively coupling at least some of said digital signals through a first plurality of bidirectional devices to a plurality of conductive columns having a second ordered sequence, each of said columns being coupled to at least one of said data bus lines by one of said bidirectional devices;
storing said digital signals on at least some of said columns in a plurality of latches, each column being coupled to one of said latches, said column being latched by one of said latches at the stored logical value corresponding to the logical value of said digital signal coupled to said latch; and
selectively coupling an ordered subsequence of said second ordered sequence of columns to said plurality of data bus lines through a second plurality of bidirectional devices, said digital signals on said plurality of data bus lines assuming said ordered subsequence of said columns.

12. The method of claim 11 further comprising the step of selectively coupling a signal having a predetermined logical value to at least some of said latches through a plurality of coupling devices before the step of storing said digital signals on said columns in said other latches of said plurality of latches.

13. The method of claim 12 wherein each one of said plurality of latches further comprises a latch circuit coupled to a buffer circuit, said buffer circuit having a logical high, low and floating potential output coupled to said corresponding column, said buffer circuit having said floating output potential when said digital signals on said columns are stored into said latch circuit through a gated bypass line.

14. The method of claim 13 wherein said buffer circuit is comprised of a first inverter stage driving a pull-up device and a second inverter stage driving a pull-down device, said first and second inverter stages being disenabled and causing said buffer circuit to assume said floating output potential when said digital signals are stored in said latch circuits, said first inverter stage driving said pull-up device when a high logical value is stored in said latch circuit, said second inverter stage driving said pull-down device when a low logical valve is stored in said latch circuit.

15. The method of claim 13 employed to produce a logical right shifted subsequence wherein said predetermined logical value is a logical zero and said ordered subsequence of digital signals is, from the highest order to lowest order digital signals, logical zeroes to a preselected order and then said first ordered sequence of digital signals beginning at the highest order of said first ordered sequence until said ordered subsequence is complete.

16. The method of claim 15 employed to produce an arithmetic left shifted subsequence wherein said step of selectively coupling an ordered subsequence of columns to said plurality of data bus lines includes coupling the highest order digital signal of said first ordered sequence to one of said plurality of data bus lines so that said ordered subsequence has said highest order digital signal of said first ordered sequence as the highest order digital signal of said logically left shifted subsequence.

17. The method of claim 13 employed to produce a logical left shifted subsequence wherein said predetermined logical value is a logical zero and said ordered subsequence of digital signals is, from the lowest order to highest order digital signals, logical zeroes to a preselected order and then said first ordered sequence of digital signals beginning at the lowest order of said first ordered sequence until said ordered subsequence is complete.

18. The method of claim 13 employed to produce an arithmetic right shifted subsequence wherein said predetermined logical value is that of the highest order digital signal of said first ordered sequence of digital signals, and said ordered subsequence of digital signals is, from the highest order to lowest order digital signals, said predetermined value to a preselected order and then said first ordered sequence of digital signals beginning at the highest order of said first ordered sequence until said ordered subsequence is complete.

* * * * *